United States Patent [19]

Nukui

[11] Patent Number: 5,266,851
[45] Date of Patent: Nov. 30, 1993

[54] PHASE DETECTOR
[75] Inventor: Yoshihiro Nukui, Gyoda, Japan
[73] Assignee: Advantest Corporation, Tokyo, Japan
[21] Appl. No.: 837,206
[22] Filed: Feb. 18, 1992
[30] Foreign Application Priority Data
  Feb. 18, 1991 [JP] Japan .................................. 3-023449
[51] Int. Cl.[5] .............................................. H03K 5/26
[52] U.S. Cl. ...................... 307/514; 307/516; 328/133; 328/134
[58] Field of Search ............... 307/514, 516; 328/133, 328/134

[56] References Cited

U.S. PATENT DOCUMENTS

| | | | |
|---|---|---|---|
| 4,246,497 | 1/1981 | Lawson et al. | 307/514 |
| 4,264,866 | 4/1981 | Benes | 307/516 |
| 4,308,500 | 12/1981 | Avins | 307/514 |
| 4,337,435 | 6/1982 | Munoz | 307/514 |
| 4,378,509 | 3/1983 | Hatchett et al. | |
| 4,712,060 | 12/1987 | Bailey et al. | 328/133 |
| 4,901,026 | 2/1990 | Phillips et al. | 307/514 |
| 4,987,387 | 1/1991 | Kennedy et al. | |
| 5,136,253 | 8/1992 | Ueno | 307/516 |

OTHER PUBLICATIONS

P. Conway, "Take The Jitter Out of PLLs", Electronic Design, vol. 38, No. 6, pp. 106–107, Mar. 22, 1990, Hasbrouck Heights, N.Y.

Primary Examiner—William L. Sikes
Assistant Examiner—Scott A. Ouellette
Attorney, Agent, or Firm—Staas & Halsey

[57] ABSTRACT

A phase difference signal generator responds to two input signals to generates two phase difference signals which rise at a time interval corresponding to the phase difference between the two input signals and fall at the same time. A lagging signal detector detects a lagging one of the two phase difference signals and a pulse generator responds to the detected output from the lagging signal detector to generate an appendage pulse of a width larger than a predetermined width. The appendage pulse is appended, by a pulse appending circuit, to each of the two phase difference signals to form an extend phase difference signal. A phase difference detector detects the difference between the two extended phase difference signals and outputs a low-frequency component of the difference as a voltage corresponding to the phase difference between the two input signals.

5 Claims, 6 Drawing Sheets

PHASE DETECTOR

BACKGROUND OF THE INVENTION

The present invention relates to phase detector for use in a phase-locked loop, for instance.

The phase detector is applied, for example, to a phase-locked loop as shown in FIG. 1. As is well-known in the art, the phase-locked loop comprises, for instance, a phase detector 1, a low-pass filter 2, a voltage-controlled oscillator 3, and a 1/N frequency divider 4.

The phase detector 1 receives a signal of a reference frequency fr, compares the phase of the input signal fr and the phase of a signal fv from the 1/N frequency divider 4, and applies the phase detected output $K_{PD}$ to the voltage-controlled oscillator 3 via the low-pass filter 2. The oscillation frequency fout of the voltage-controlled oscillator 3 is controlled so that the two input signals fr and fv to the phase detector 1 may become in-phase with each other, with the result that the output frequency fout becomes equal to N·fr.

FIG. 2 shows the construction of the conventional phase detector 1. The phase detector 1 is made up of a phase difference signal generator 10 and a phase difference detector 14. The phase difference signal generator 10 includes two D flip-flops 11 and 12 and a NAND gate 13. The two signals fv and fr to be compared in phase are applied to clock input terminals CK of the D flip-flops 11 and 12, respectively. A voltage VCC of an H-logic level is applied to a date input terminal D of each of the D flip-flops 11 and 12.

Phase difference signals $\phi v$ and $\phi r$ from output terminals Q of the D flip-flops 11 and 12 are applied to two inputs of the NAND gate 13, the output of which is fed to clear terminals CLR of the D flip-flops 11 and 12. Consequently, when the output terminals Q of the D flip-flops 11 and 12 both go to H-logic, the D flip-flops 11 and 12 are cleared and the output terminals Q both return to the L-logic state.

In this way, there can be obtained at the output terminals Q of the D flip-flops 11 and 12 the two phase difference signals $\phi v$ and $\phi r$ which rise at a time interval corresponding to the phase difference $\phi$ between the two input signals fv and fr but simultaneously fall as depicted in FIG. 3. The phase difference signals $\phi v$ and $\phi r$ are provided to the phase difference detector 14. The phase difference detector 14 detects the difference in rise time between the phase difference signals $\phi v$ and $\phi r$ and outputs the difference after subjecting it to low-pass filtering. Thus it is possible to obtain a voltage Vout corresponding to the phase difference $\phi$ between the two input signals fv and fr.

With the construction of the phase detector 1 shown in FIG. 2, as the phase difference between the two input signals fv and fr approaches zero, the pulse widths of the phase difference signals $\phi v$ and $\phi r$ provided from the output terminals of the D flip-flops 11 and 12 become very narrow as depicted at the right-hand side in FIG. 3, resulting in the peak values of the phase difference signals $\phi v$ and $\phi r$ becoming unstable. In order words, the peak values of the phase difference signals $\phi v$ and $\phi r$ gradually diminish as the phase difference $\phi$ is reduced toward zero.

As the result of this, when the phase difference is close to zero, the output voltage of the phase difference signal generator 10 becomes extremely low and its sensitivity also lowers accordingly. In consequence, the phase difference $\phi$ between the two signals fv and fr and the output voltage Vout bear a relationship which is nonlinear in the vicinity of the phase difference $\phi$ equal to zero as depicted in FIG. 4, and the gain of the phase detector 1 is reduced accordingly. That is to say, the phase detector 1 has a dead zone $\Delta D$ in the vicinity of the phase difference $\phi$ equal to zero, and hence is defective in that the output frequency fout of the phase-looked loop varies in the range of the dead zone $\Delta D$.

SUMMARY OF THE INVENTION

It is therefore an object of the present invention to provide a phase detector the gain of which does not decrease even when the phase difference between two input signals is close to zero.

The phase detector according to the present invention includes: phase difference signal generating means for generating two phase difference signals which rise at a time interval corresponding to the phase difference between two input signals but fall at the same time; lagging signal detecting means for detecting the arrival of a lagging one of the two input signals; pulse generating means for generating an appendage pulse of a pulse width greater than the width of the above-mentioned dead zone, based on the lagging signal detecting timing; pulse appending means for appending the appendage pulse to each of the two phase difference signals to create two extended phase difference signals; and phase difference detecting means for detecting the difference between the two extended phase difference signals and for outputting a low-frequency component of the difference as a voltage corresponding to the phase difference between the two input signals.

According to the present invention, the two phase difference signals, which rise at a time interval corresponding to the phase difference between two input signals and fall at the same time, are each appended with a pulse of a width larger than that of the dead zone, and consequently, even if the phase difference between the two input signals is zero, the phase difference detecting means is supplied with the extended phase difference detecting means is supplied with the extended phase difference signals of a width large than that of the dead zone. This enables the phase difference detecting means to stably perform the difference calculating operation, and hence permits avoidance of the reduction of the gain. Thus the present invention prevents the generation of the dead zone in the vicinity of the phase difference equal to zero and offers a phase detector of good linearity.

DESCRIPTION OF THE PREFERRED EMBODIMENTS

Figure 5:
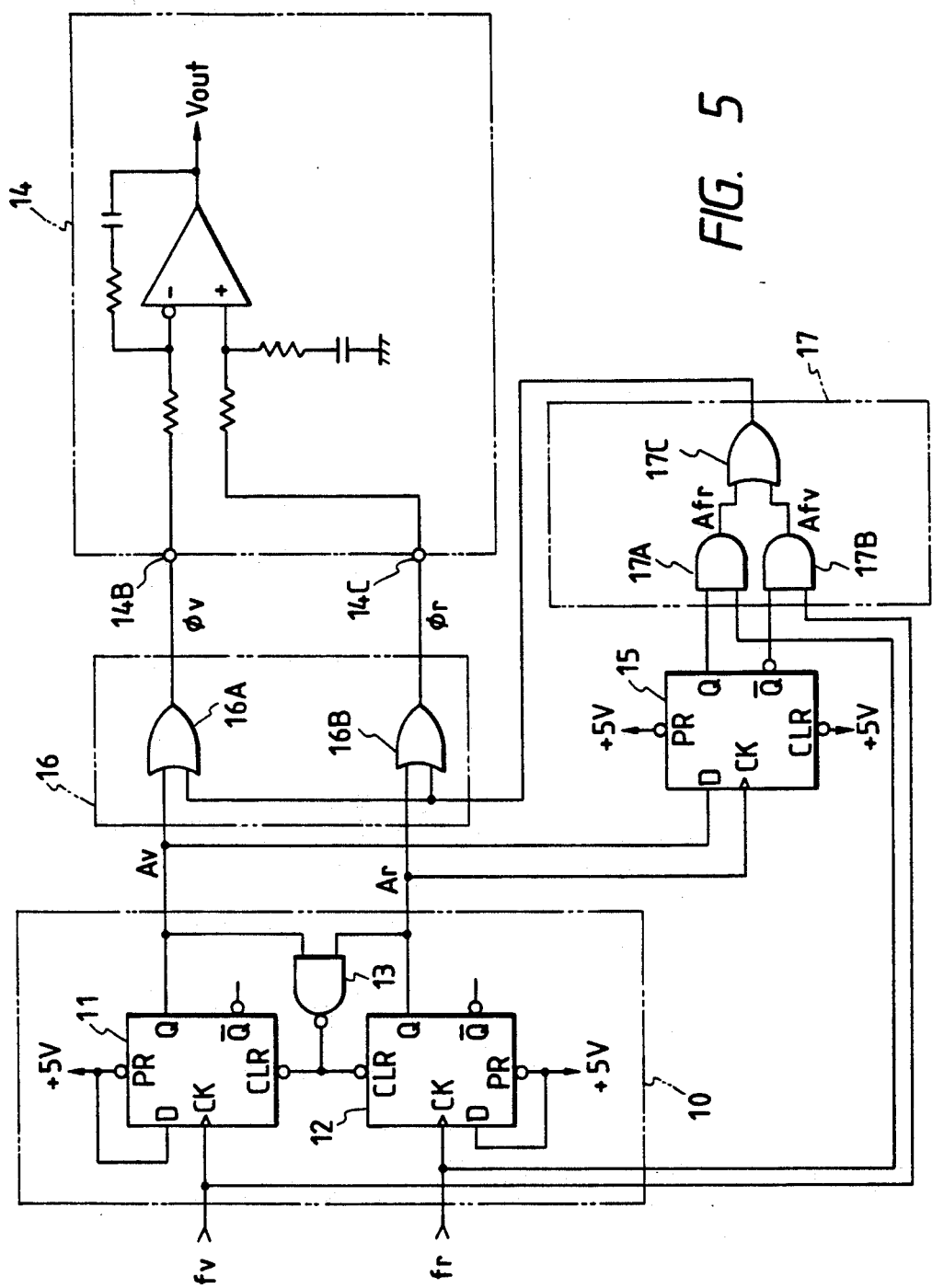
FIG. 5 is a connection diagram illustrating an embodiment of the phase detector according to the present invention.

In FIG. 5, illustrates an embodiment of the phase detector according to the present invention. The phase detector of the present invention is identical with the prior art example of FIG. 2 in the provision of the phase difference signal generator 10 for generating two phase difference signals Av and Ar which rise at a time interval corresponding to the phase difference $\phi$ between the two input signals fv and fr but fall simultaneously and the phase difference detector 14 which detects the phase difference between the two phase difference signals and outputs a low-frequency component of the difference. According to the present invention, a lagging signal detecting circuit 15 for detecting the arrival of a lagging one of the two input signals fv and fr, a pulse generating circuit 17 responsive to the detected output from the lagging signal detecting circuit 15 to generate an appendage pulse of a width larger than that $\Delta D$ of the dead zone of the phase difference detector 14 and a pulse appending circuit 16 for appending the appendage pulse to each of the two phase difference signals output from the phase difference generator 10 are provided between the phase difference signal generator 10 and the phase difference detector 14.

The lagging signal detecting circuit 15 is formed by a D flip-flop, for example, and the pulse generating circuit is made up of two AND gates 17A and 17B connected to two output terminals Q and $\overline{Q}$ of the D flip-flop 15 and an OR gate 17C for ORing the outputs of the two AND gates 17A and 17B. The D flip-flop 15 has its data input terminal D and clock input terminal CK connected to the output terminals Q of the D flip-flops 11 and 12 forming the phase difference signal generator 10, respectively, and the D flip-flop 15 is supplied with the two phase difference signals Av and Ar.

In the embodiment of FIG. 5 the signal fv is applied to the clock input terminal CK of the one D flip-flop 11 forming the phase difference signal generator 10, the data input terminal D of the D flip-flop 15 forming the lagging signal detector is connected to the output terminal Q of the D flip-flop 11, the signal fr is applied to the clock input terminal CK of the D flip-flop 12, and the clock input terminal CK of the D flip-flop 15 forming the lagging signal detector is connected to the output terminal Q of the other D flip-flop 12 forming the phase difference signal generator 10.

The AND gate 17A of the pulse generator 17 is supplied at the other input terminal with the input signal fr and the AND gate 17B is supplied at the other input terminal with the input signal fv. If the signal Av provided from the output terminal Q of the D flip-flop 11 has already been at the H level at the point of time when the signal Ar which is provided from the output terminal Q of the D flip-flop 12, that is, if the input signal fr is a lagging signal, than the output at the terminal Q of the D flip-flop 15 goes to the H-logic level at the point of time when the lagging signal fr rises. Consequently, when the input signal fr which is a lagging signal rises and then the phase difference signal Ar rises in response thereto, the D flip-flop 15 reads therein the H-logic output provided at the output terminal Q of the flip-flop 11 and provides an H-logic output at the output terminal Q. Thus, in this instance the AND gate 17A is enabled, through which the input signal fr is output as an appendage pulse Afr to be generated.

On the other hand, in the case where the input signal fr is leading the other input signal fv, when the signal fr rises, the output at the terminal Q of the flip-flop 12 goes to the high level and at this point the output at the terminal Q of the D flip-flop 11 is low, and the D flip-flop 15 forming the lagging signal detector reads therein the L-logic output from the flip-flop 11. Consequently, in this case, the D flip-flop 15 forming the lagging signal detector outputs the H-logic level at the output terminal $\overline{Q}$, and hence the AND gate 17B is enabled, through which the input signal fv is output as an appendage pulse Afv to be generated.

In this way, the lagging signal detector 15 detects a lagging one of the input signals fv and fr, and the AND gates 17A and 17B of the pulse generator 17 output, as the appendage pulse Afv or Afr, the lagging one of the input signals fv and fr. The appendage pulse Afv or Afr thus produced is provided via the OR gate 17C to the pulse appending circuit 16. The pulse appending circuit 16 includes two OR gates 16A and 16B, which are supplied at one input terminals with the phase difference signals Av and Ar which are provided from the output terminals Q of the D flip-flops 11 and 12, respectively. The appendage pulse Afv or Afr is appended to the two phase difference signals Ac and Ar to form the extended phase difference signals $\phi v$ and $\phi r$.

Figure 6:
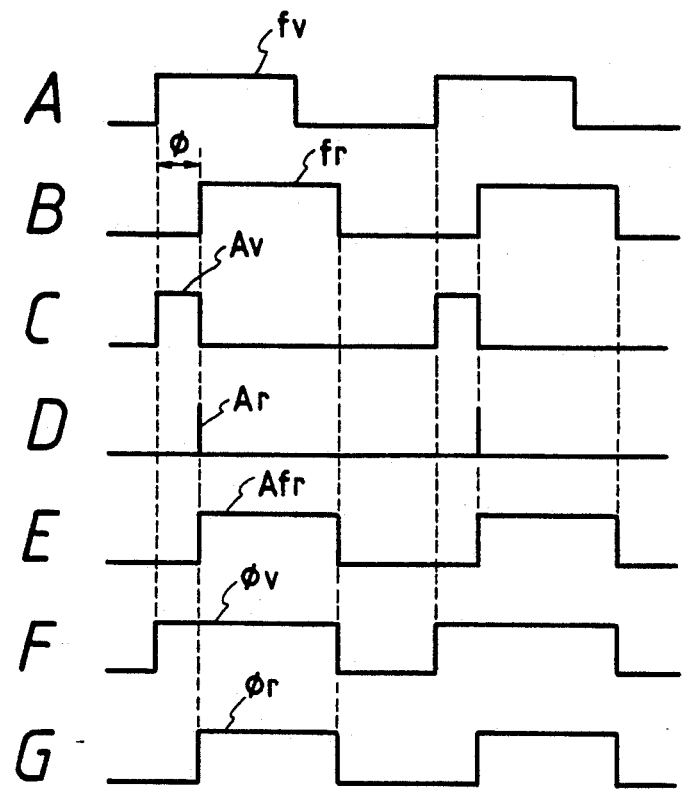
FIG. 6 is a waveform diagram for explaining the operation of the phase detector according to the present invention.

FIG. 6 shows the above-described operation. In this example the input signal fv leads the signal fr by $\phi$ as shown on Rows A and B. The D flip-flops 11 and 12 output the phase difference signals Av and Ar shown on Rows C and D. Since the signal fr lags the signal fv, the output terminal Q of the lagging signal detector 15 goes high, by which the gate 17A is enabled and the signal fr is output, as the appendage pulse Afr, from the pulse generator 17 as shown on Row E in FIG. 6. In the pulse appending circuit 16 the phase difference signals Av and Ar are respectively appended with the appendage pulse Afr and output as the extended phase difference signals $\phi v$ and $\phi r$ shown on Rows F and G in FIG. 6, which are applied to the phase difference detector 14.

Figure 1:
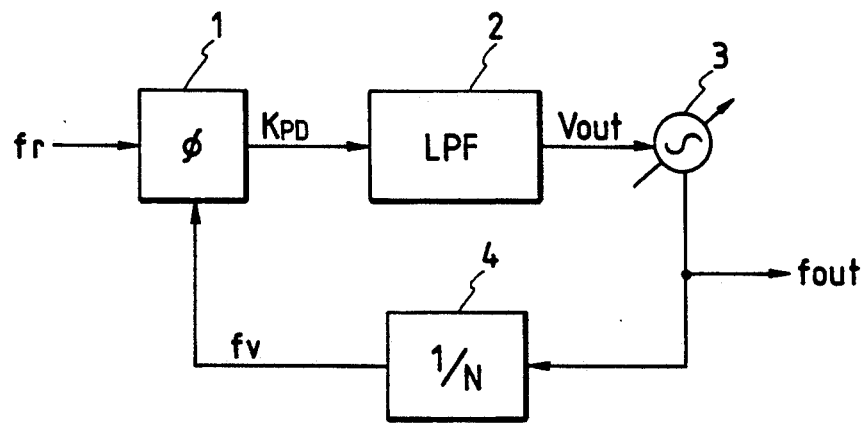
FIG. 1 is a block diagram showing the construction of a phase-locked loop, showing an example of application of a phase detector.
Figure 2:
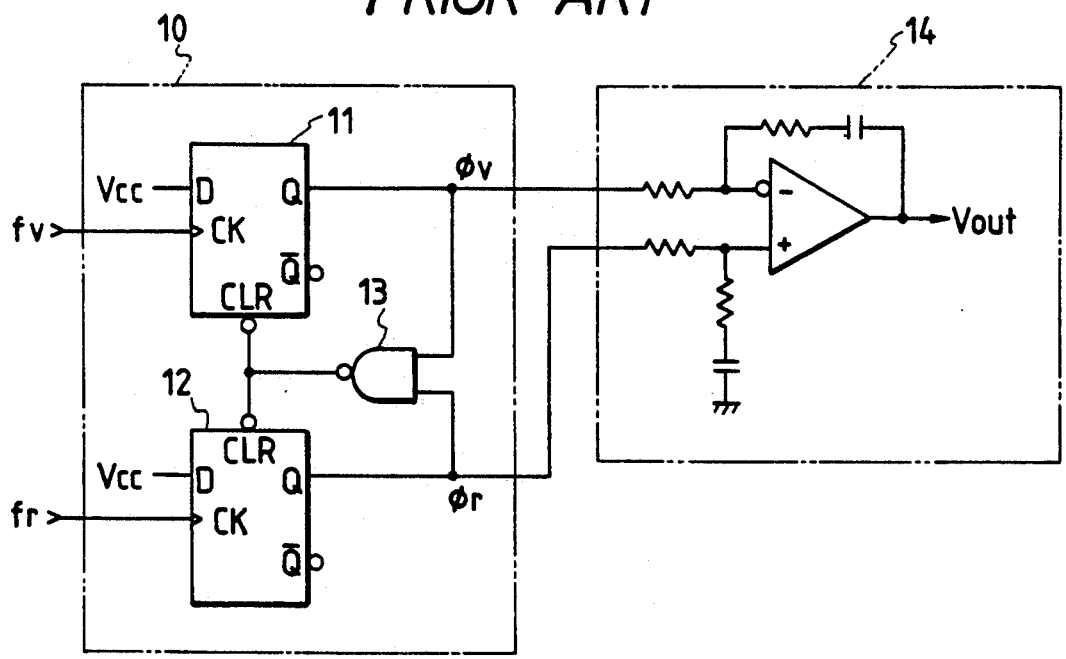
FIG. 2 is a connection diagram showing the construction of a conventional phase detector.
Figure 3:
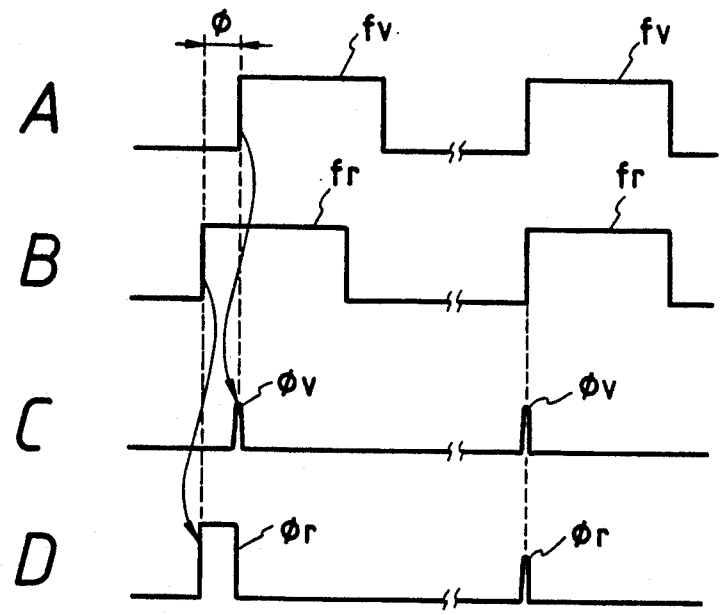
FIG. 3 is a waveform diagram for explaining the operation of the conventional phase detector.
Figure 4:
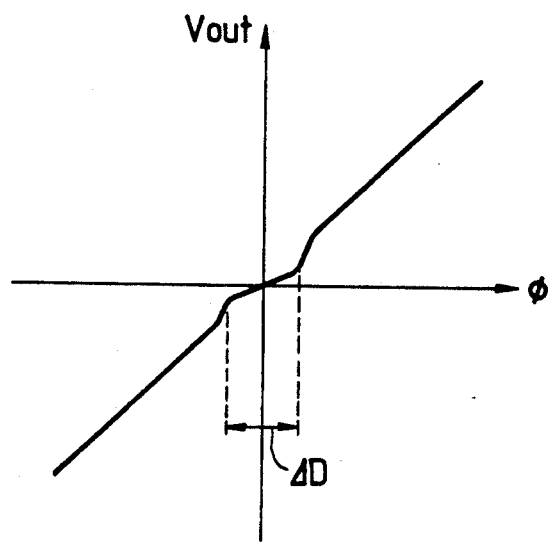
FIG. 4 is a graph showing the detection characteristic of the conventional phase detector.

In a manner similar to the prior art example of FIG. 2, the phase difference detector 14 detects the difference between the two extended phase difference signals $\phi v$ and $\phi r$ and then outputs a low-frequency component of the difference as voltage corresponding to the phase difference $\phi$ between the input signals fv and fr. Even if the phase difference $\phi$ between the two input signals fv and fr is smaller than the width $\Delta D$ of the dead zone, the phase difference detector 14 stably operates, because the extended phase difference signals $\phi v$ and $\phi r$ each have a pulse width larger than the width $\Delta D$ of the dead zone. Assume, however, that the pulse widths of the input signals fv and fr themselves are larger than the dead zone width $\Delta D$.

Figure 7:
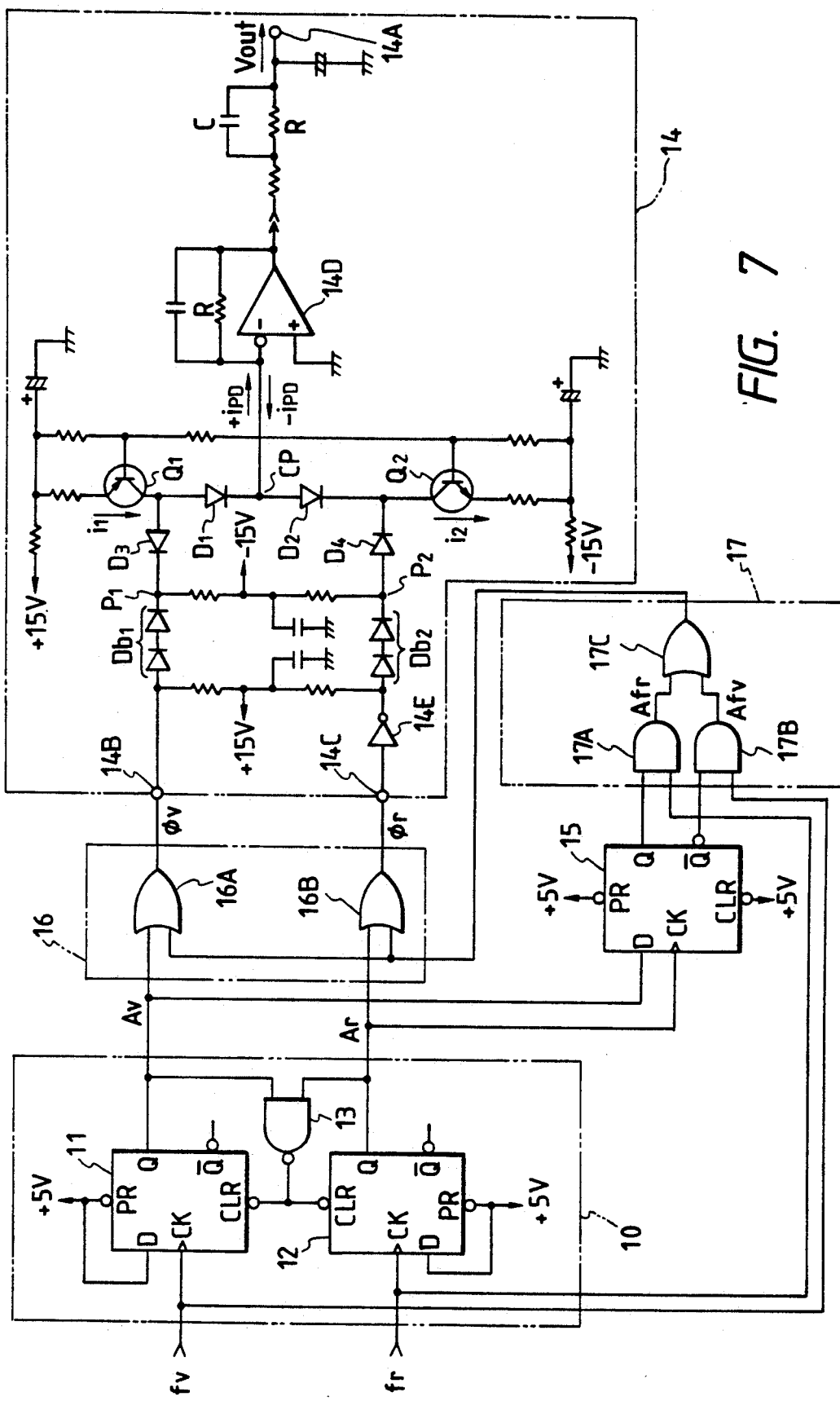
FIG. 7 is a circuit diagram illustrating another embodiment of the present invention.

FIG. 7 illustrates another embodiment of the present invention. The phase difference signal generator 10, the lagging signal detector 15, the pulse generator 17 and the pulse appending circuit 16 are exactly identical in construction with those used in the FIG. 5 embodiment, and hence no description will be given of them. In this embodiment the phase difference detector 14 is formed by current-driven circuits so that it is capable of high-speed operations.

A transistor Q1, switching diodes D1, D2 and a transistor Q2 are connected in series, and the types and directions of the transistors Q1 and Q2 and the directions of the diodes D1 and D2 are selected so that constant currents $i_1$ and $i_2$ of the same magnitude may flow in the series connection in the same direction (opposite directions with respect to the transistors Q1 and Q2). A +15 V power supply and −15 V power supply are respectively connected via resistors to both ends of the series connection, by which the currents $i_1$ and $i_2$ are supplied to the transistors Q1 and Q2 which are effecting constant current operation. The connection point CP of the switching diodes D1 and D2 is connected to an inverting input terminal of an operational amplifier forming a current-voltage converter 14D and is held at a virtual grounding potential. The input transistors Q1 and Q2 have their collectors connected to the anode of a switching diode D3 and the cathode of a switching diode D4, respectively. The extended phase difference signal $\phi v$ applied to an input terminal 14B is provided to the cathode of the switching diode D3 via a bias adjusting series-connected diode pair Db1. The extended phase difference signal $\phi r$ applied to an input terminal 14C is inverted by an inverter 14E, thereafter being provided to the anode of the switching diode D4 via a bias adjusting series-connected diode pair Db2.

When the extended phase difference signal $\phi v$ is H-logic, the potential at a connection point P1 is higher than the virtual grounding potential at the connection point CP, so that the switching diode D3 is turned OFF and the switching diode D1 ON. Consequently, the constant current $i_1$ flowing across the transistor Q1 is applied, as a current $+i_{PD}$, to the current-voltage converter 14D. When the extended phase difference signal $\phi v$ is L-logic, the potential at the connection point P1 is a junction voltage of the bias adjusting series-connected diode pair Db1 and hence is lower than the potential at the connection point CP, turning ON the switching diode D3 and OFF the switching diode D1. Consequently, the constant current $i_1$ flows into the −15 V power supply via the diode D3 and the current $+i_{PD}$ is zero. On the other hand, when the extended phase difference signal $\phi r$ is H-logic, the potential at a connection point P2 is a junction voltage of the bias adjusting series-connected diode pair Db2 and hence is lower than the virtual grounding potential at the connection point CP, so that the switching diode D4 is turned OFF and the switching diode D2 ON. Consequently, the constant current $i_2$ flowing across the transistor Q2 is supplied as a current $-i_{PD}$ from the current-voltage converter 14D. When the extended phase difference signal $\phi r$ is L-logic, the potential at the connection point P2 is sufficiently higher than the potential at the connection point CP, turning ON the switching diode D4 and OFF the switching diode D2. Hence the constant current $i_2$ flowing in the transistor Q2 is supplied from the +15 V power supply via the diode pair Db2 and the diode D4 and the current $-i_{PD}$ is zero.

As will be seen from the above, when the extended phase difference signals $\phi v$ and $\phi r$ are both H-logic, the switching diodes D1 and D2 are simultaneously turned ON and the input currents $+i_{PD}$ and $-i_{PD}$ cancel each other and become zero, with the result that the constant current $i_1$ in the transistor Q1 flows into the transistor Q2. That is, the output voltage of the current-voltage converter 14D is zero. When the extended phase difference signals $\phi v$ and $\phi r$ are both L-logic, the switching diodes D1 and D2 are simultaneously turned OFF, and also in this instance, the output voltage of the current-voltage converter 14D is zero. When the signal $\phi v$ is H-logic and the signal $\phi r$ is L-logic, the constant current $i_1$ flows, as the current $-i_{PD}$, into the current-voltage converter 14D, from which is provided a voltage corresponding to the current. When the signal $\phi v$ is L-logic and the signal $\phi r$ H-logic, the constant current $i_2$ is supplied, as the current $-i_{PD}$, to the current-voltage converter 14D, from which is provided a voltage corresponding to the current. The output voltage of the current-voltage converter 14D is average by a low-pass filter composed of a capacitor C and a resistor R, thereafter being provided, as the voltage Vout proportional to the phase difference $\phi$ between the two input signals fv and fr, to a terminal 14A.

Figure 8:
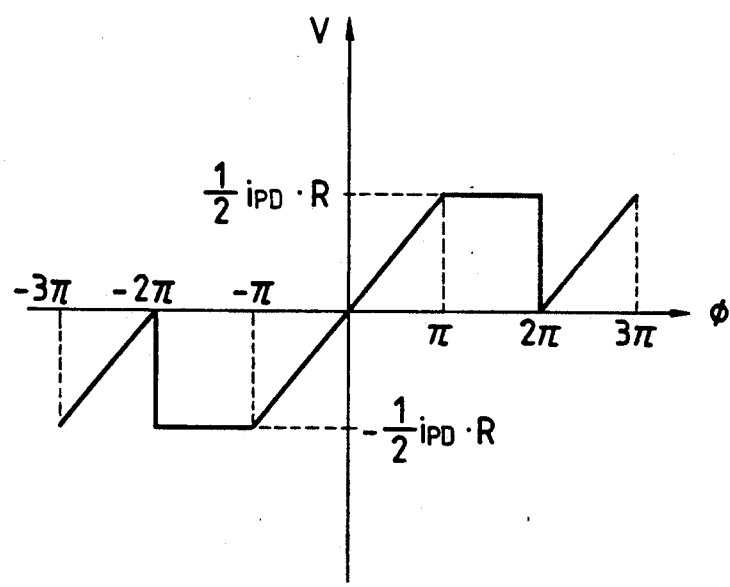
FIG. 8 is a graph showing the detection characteristic of the phase detector according to the present invention.

FIG. 8 shows the phase detection characteristic of the phase detector depicted in FIG. 7. The phase detector according to the present invention is able to perform phase detection with good linearity between $\pi$ and $-\pi$, as shown.

Figure 9:
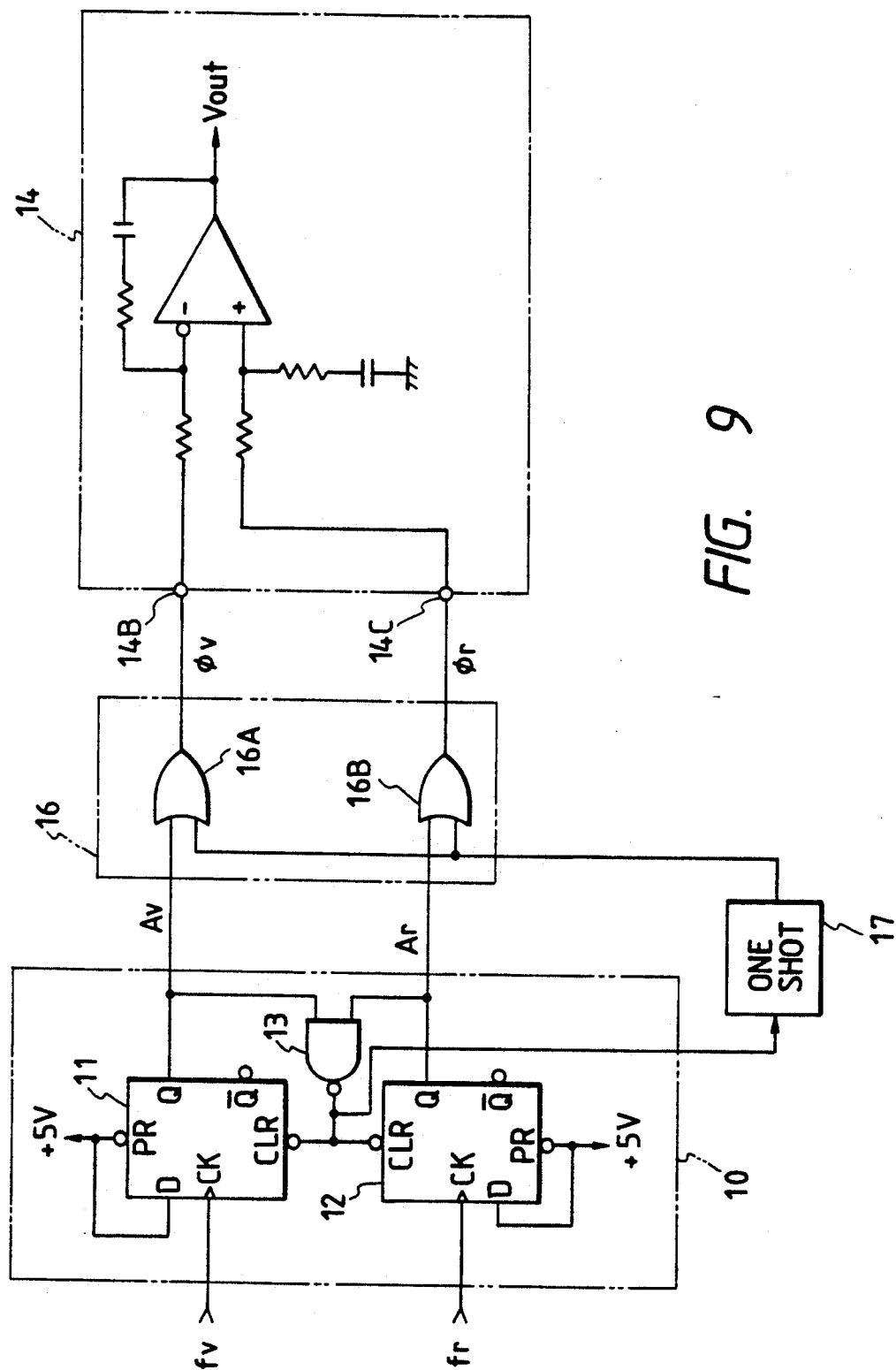
FIG. 9 is a circuit diagram illustrating still another embodiment of the present invention.

In the embodiments of FIGS. 5 and 7 it is also possible to employ a construction in which the NAND gate 13 is used also as the lagging signal detector 15 and the pulse generator 17 is a one-shot multivibrator which outputs pulses of a fixed width. FIG. 9 illustrates such a modification of the FIG. 5 embodiment. One of the input signals fv and fr rises when the output of the NAND gate 13 is H-logic, and then when the other input signal rises, the NAND gate 13 responds thereto to make its output L-logic. In other words, the rise time point of the lagging one of the input signals is thus detected. Triggered by the rise of the NAND gate 13, the one-shot multivibrator 17 outputs an appendage pulse of a width which is, for example, one half the period of the signal fv (equal to the period of the signal fr and longer than the dead zone width $\Delta D$). The appendage pulse thus generated is applied to the pulse appending circuit 16, wherein it is appended to each of the phase difference signals Av and Ar to form the extended phase difference signals $\phi v$ and $\phi r$.

This embodiment is advantageous in that even when the duty ratio of each of the input signal fv and fr is smaller than 50%, the phase difference $\phi$ can be detected in the range of from $-\pi$ to $+\pi$. Since the one-shot multivibrator for generating a pulse of a fixed width is difficult to operate at high speed, however, the FIG. 9 embodiment is suitable for phase detection at relatively low frequencies. In contrast to this, the pulse generator 17 in the embodiments of FIGS. 5 and 7 outputs the lagging signal fv or fr detected by the lagging signal detector 15, as the appendage pulse via the gate 17A or 17B, so that when the duty ratios of the signals fv and fr become smaller than 50%, the range over which the phase difference can be detected by the phase difference detector 14 becomes narrower than the above-mentioned range of between $-\pi$ and $+\pi$. However, since the lagging signal detector 15 and the pulse generator 17 are capable of high-speed operation, the embodiments of FIGS. 5 and 7 are suitable for phase detection at high frequencies. In particular, in the FIG. 7 embodiment the phase difference detector 14 detects the phase difference while cancelling the in-phase components of the signals $\phi v$ and $\phi r$ by switching the currents $i_1$ and $i_2$ by the diodes D21 through D45, and henxe is capable of operating at far higher speed than the phase difference detector 14 in the FIG. 5 embodiment.

As described above, the present invention employs the construction in which the phase difference signals Av and Ar are each appended with an appendage pulse of a width larger than the width of the dead zone of the phase difference detector 14 and then are applied thereto—this ensures that the extended phase difference signal Afv or Afr of a pulse width larger than the dead zone width is applied to the phase difference detector 14, even if the phase difference $\phi$ between the input signals fv and fr approaches zero. Hence, even if the peak values of the phase difference signals Av and Ar, which are detected in the vicinity of the phase difference $\phi$ equal to zero, vary and become small, it is possible to stably perform the phase detection without being affected by such varying peak values of the phase difference signals and eliminate the dead zone of the phase difference detector.

It will be apparent that many modifications and variations may be effected without departing from the scope of the novel concepts of the present invention.

What is claimed is:

1. A phase detector comprising:
    phase difference signal generating means for generating two phase difference signals which rise at a time interval corresponding to the phase difference between two input signals and fall at the same time;
    lagging signal detecting means for detecting the arrival of a lagging one of said two input signals;
    pulse generating means responsive to the detected output of said lagging signal detecting means to generate an appendage pulse which rises at a time point of detection of the lagging signal and has a pulse width larger than a predetermined width;
    pulse appending means for appending said appendage pulse to each of said two phase difference signals to form two extended phase difference signals; and
    phase difference detecting means for detecting the difference between said two extended phase difference signals and for outputting a low-frequency component of the detected difference as a voltage corresponding to the phase difference between said two input signals.

2. The phase detector of claim 1 wherein said lagging signal detecting means is formed by a D flip-flop which is supplied at a data terminal with the one of said two phase difference signals and at a clock input terminal with the other of said two phase difference signals, and wherein said pulse generating means is formed by first and second AND gates which are supplied at one input terminal with a non-inverted output and an inverted output of said D flip-flop, respectively, and at other input terminals with said two input signals, respectively, and an OR gate which outputs the OR of outputs of said first and second AND gates as said additional pulse.

3. The phase detector of claim 1 wherein said phase difference signal generating means includes first and second flip-flops which are supplied at clock input terminals with said two input signals, respectively, and respond to the rising of said input signals to output predetermined logic levels, and AND gate means which is supplied at one and an other input with outputs of said first and second flip-flops and generates a setting signal for setting said first and second flip-flops to their initial state when their outputs are both said predetermined logic levels, wherein said lagging signal detecting means is used also as said AND gate means, and wherein said pulse generating means is a one-shot multivibrator which responds to said setting signal from said AND gate means to generate said appendage pulse of a fixed width larger than said predetermined width.

4. The phase detector of claim 1 wherein said phase difference detecting means includes:
    first and second constant-current circuit means for supplying constant currents of reverse polarities;
    first and second switching diodes having anodes connected to an output of said first constant-current circuit means;
    third and fourth switching diodes having cathodes connected to an output of said second constant-current circuit means, a cathode of said first switching diode being connected to an anode of said third switching diode;
    current-voltage converting means connected to a connection point of said first and third switching diodes, for converting an input current thereto into a corresponding voltage;
    low-pass filter means for averaging the output voltage of said current-voltage converting means and for outputting it as a voltage corresponding to the phase difference between said two input signals;
    first bias control means for providing a control bias to a cathode of said second switching diode so that when one of said two extended phase difference signals from said pulse appending means has one logic level, said first and second switching diodes are turned ON and OFF, respectively, and when said one extended phase difference signal has an other logic level, said first and second switching diodes are turned OFF and ON, respectively; and
    second bias control means for providing a control bias to an anode of said fourth switching diode so that when the other of said two extended phase difference signals from said pulse appending means has the one logic level, said third and forth switching diodes are turned ON and OFF, respectively, and when said other extended phase difference signal has the other logic level, said third and fouth switching diodes are turned OFF and ON, respectively.

5. The phase detector of claim 3 wherein said predetermined width is the width of a dead zone of said phase difference detecting means.

* * * * *